(12) United States Patent
Tu

(10) Patent No.: US 9,048,822 B2
(45) Date of Patent: Jun. 2, 2015

(54) SINGLE ENDED RING OSCILLATOR WITH FULLY DIFFERENTIAL SIGNAL

(71) Applicant: Realtek Semiconductor Corp., Hsinchu (TW)

(72) Inventor: Chuan Ping Tu, Chu Tung Town (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 14/158,034

(22) Filed: Jan. 17, 2014

(65) Prior Publication Data
US 2014/0210562 A1    Jul. 31, 2014

(30) Foreign Application Priority Data

Jan. 25, 2013  (TW) .............................. 102102907 U

(51) Int. Cl.
*H03K 3/03*   (2006.01)
(52) U.S. Cl.
CPC ................... *H03K 3/0322* (2013.01)

(58) Field of Classification Search
USPC ....................................... 331/57, 45
See application file for complete search history.

(56) References Cited

U.S. PATENT DOCUMENTS

2007/0018737 A1*  1/2007  Drake et al. .................... 331/57
2007/0241826 A1* 10/2007  Ueno .............................. 331/57

* cited by examiner

*Primary Examiner* — Joseph Chang
(74) *Attorney, Agent, or Firm* — Muncy, Geissler, Olds & Lowe, P.C.

(57) ABSTRACT

A single-ended ring oscillation device for generating a fully differential signal is provided. The single-ended oscillation device includes a single-ended ring oscillator and a phase processing unit. The single-ended ring oscillator includes an odd number of inverting delay units. The inverting delay units sequentially generate a first signal, a second signal and a third signal. The phase processing unit generates an intermediate signal according to the first signal and the third signal, and outputs the intermediate signal and a delayed version of the second signal as a fully differential signal. The intermediate signal and the second signal are opposite to each other in phase.

13 Claims, 7 Drawing Sheets

400

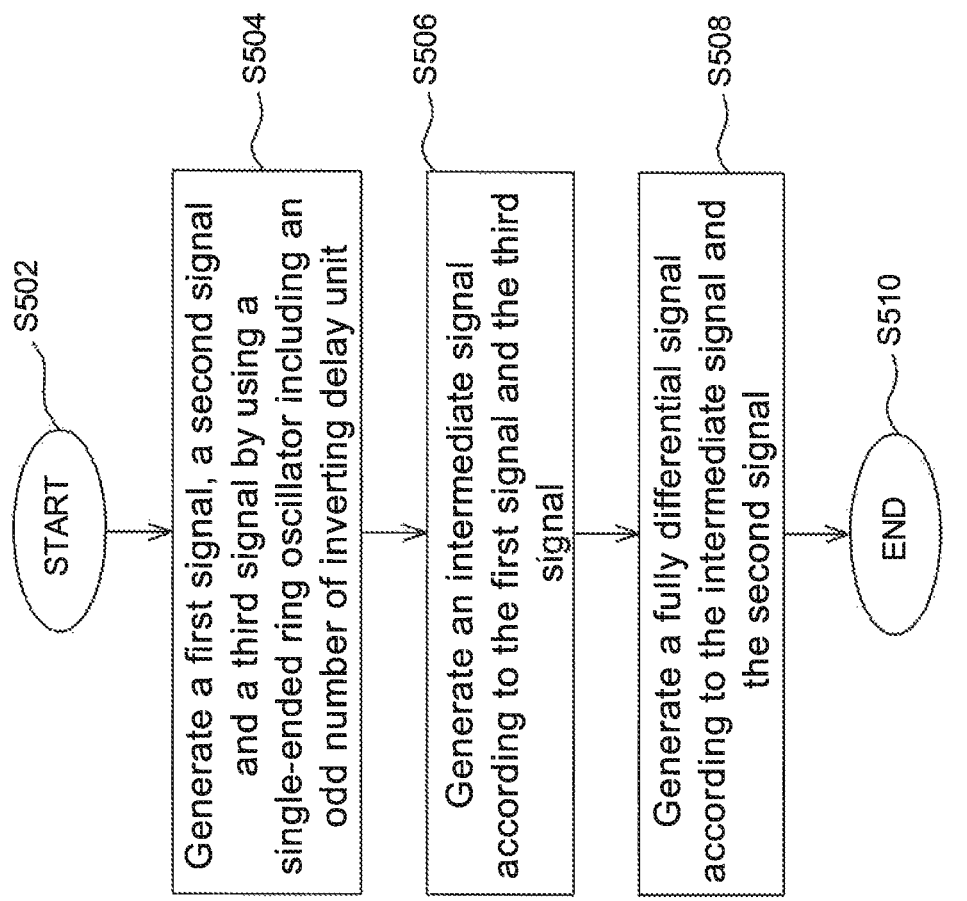

SINGLE ENDED RING OSCILLATOR WITH FULLY DIFFERENTIAL SIGNAL

This application claims the benefit of the filing date of Taiwan Application Ser. No. 102102907, filed on Jan. 25, 2013, the content of which is incorporated herein by reference.

BACKGROUND OF THE INVENTION

1. Field of the invention

The invention relates to a signal generating device and method, and more particularly, to a single-ended oscillation device for generating a fully differential signal and method thereof.

2. Description of the Related Art

FIG. 1 is a schematic diagram of a conventional single-ended ring oscillator. A conventional single-ended ring oscillator 100 must include an odd number of inverting delay units, but cannot generate fully differential signals. In order to solve this problem, signals generated by two adjacent inverting delay units are differential-amplified to obtain full swing output signals. However, since the signals generated by the two adjacent inverting delay units are not fully differential signals (their phase difference is 180 degrees and there is a time delay of an inverting delay unit), the above approach can't generate fully swing differential output signals with a duty cycle of about 50%.

As shown in FIG. 2, when a differential ring oscillator 200 is used, the fully differential signals can be provided and amplified to obtain the fully swing differential output signals with a duty cycle of about 50%. However, with the same oscillation frequency, the power consumption of the differential ring oscillator is greater than that of the single-ended oscillator; besides, the circuit design of the differential ring oscillator is more complicated than that of the single-ended oscillator.

SUMMARY OF THE INVENTION

In view of the above-mentioned problems, an object of the invention is to provide a single-ended oscillation device for generating fully differential signals, capable of reducing the power consumption and the manufacturing cost.

Another object of the invention is to provide a single-ended oscillation device for generating fully differential signals, causing a relatively power-saving and easy design single-ended ring oscillator to output the fully differential signals in order to generate output signals with a duty cycle of about 50%.

One embodiment of the invention provides a single-ended oscillation device for generating a fully differential signal. The single-ended oscillation device comprises a single-ended ring oscillator and a phase processing unit. The single-ended ring oscillator comprises an odd number of inverting delay units and the inverting delay units sequentially generate a first signal, a second signal and a third signal. The phase processing unit is for generating an intermediate signal according to the first signal and the third signal and outputting the intermediate signal and a delayed version of the second signal as the fully differential signal. Here, the intermediate signal and the second signal are substantially opposite to each other in phase.

Another embodiment of the invention provides a single-ended oscillation device for generating a fully differential signal. The single-ended oscillation device comprises a single-ended ring oscillator and a phase processing unit. The single-ended ring oscillator comprises an odd number of inverting delay units. Each odd-numbered inverting delay unit generates an odd number signal and each even-numbered inverting delay unit delays a corresponding odd number signal of its previous-stage odd-numbered inverting delay unit to generate an even number signal. The phase processing unit delays each odd number signal to generate a delayed odd number signal. The phase processing unit generates an intermediate signal according to two adjacent delayed odd number signals and delays a corresponding even number signal between two adjacent odd number signals associated with the two adjacent delayed odd number signals to generate the fully differential signal. Here, the corresponding even number signal and the intermediate signal are aligned and opposite to each other in phase.

Another embodiment of the invention provides a method for generating a fully differential signal by using single-ended oscillation device. The method comprises the steps of: generating a first signal, a second signal and a third signal by using a single-ended ring oscillator including an odd number of inverting delay units; generating an intermediate signal according to the first signal and the third signal; and, generating a fully differential signal according to the intermediate signal and the second signal; wherein the first signal, the second signal and the third signal are oscillation signals.

In this manner, without using the conventional differential ring oscillator, the single-ended oscillation device and method thereof according to an embodiment of the invention generates the fully differentially signals and achieves the goal of reducing the circuit cost and the power consumption.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 5 is a flow chart showing a method of generating a fully differential signal by using a single-ended oscillation device according to an embodiment of the invention.

DETAILED DESCRIPTION OF THE INVENTION

Figure 1:
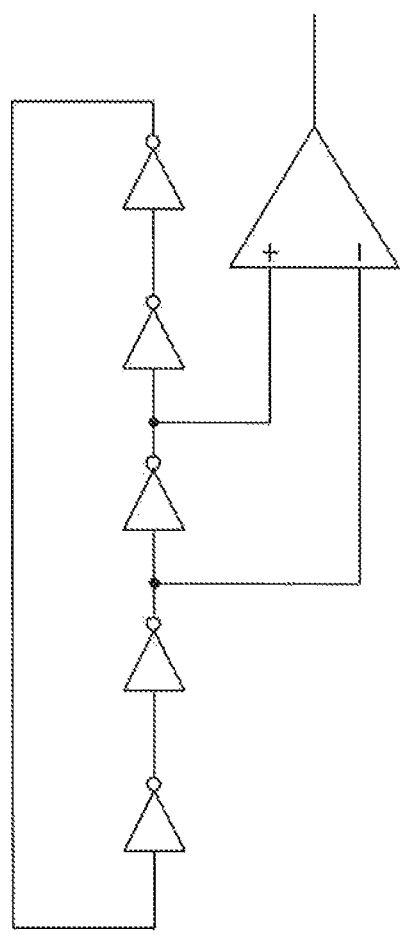
FIG. 1 is a schematic diagram of a conventional single-ended ring oscillator.
Figure 2:
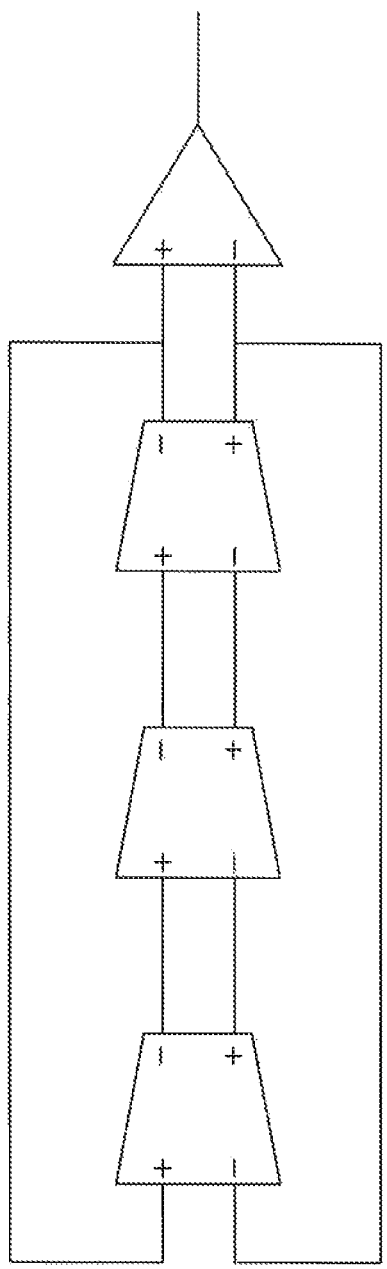
FIG. 2 is a schematic diagram of a conventional differential ring oscillator.
Figure 3:
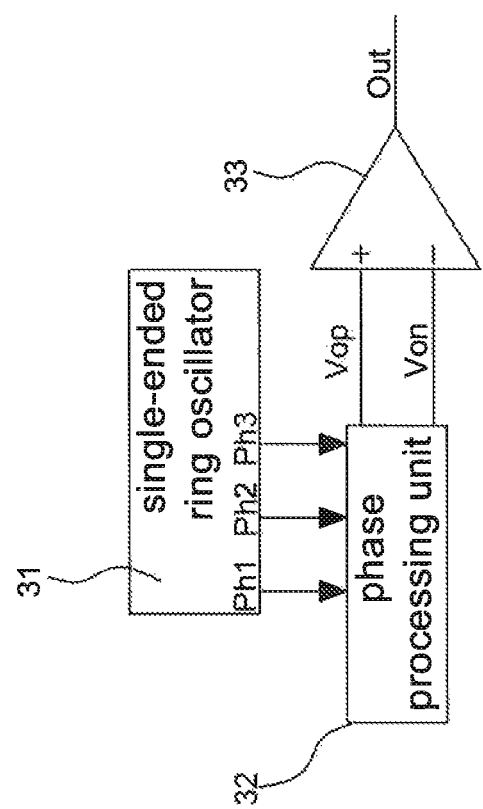
FIG. 3 is a schematic diagram showing a single-ended oscillation device for generating a fully differential signal according to an embodiment of the invention.

FIG. 3 is a schematic diagram showing a single-ended oscillation device 300 for generating a fully differential signal according to an embodiment of the invention. The single-ended oscillation device 300 includes a single-ended ring oscillator 31, a phase processing unit 32 and an amplifier 33.

The single-ended ring oscillator 31 includes an odd number (e.g., more than three) of inverting delay units (not shown). The inverting delay units delay an input signal and sequentially generate a first signal Ph1, a second signal Ph2, and a third signal Ph3. Here, the second signal Ph2 has a phase opposite to those of the first signal Ph1 and the third signal Ph3. There is a time delay between the first signal Ph1 and the second signal Ph2, as well as between the second signal Ph2 and the third signal Ph3.

The phase processing unit 32 calculates (e.g., add or interpolate) the first signal Ph1 and the third signal Ph3 to generate an intermediate signal Phm. Here, the intermediate signal Phm and the second signal Ph2 are substantially opposite to each other in phase, i.e., substantially having a phase difference of 180 degrees. Signals with a phase difference of 180 degrees are fully differential signals. The phase processing unit 32 outputs the intermediate signal Phm and a delayed version of the second signal Ph2 as the fully differential signal Vop and Von.

Afterward, the amplifier 33 amplifies the fully differential signal Vop and Von to generate a full swing signal with a duty cycle of 50%.

In this manner, the single-ended oscillation device 300 of the invention uses the phase processing unit 32 for generating the fully differentially signals and uses the amplifier 33 for amplifying the fully differentially signals to generate the full swing signals. Without using the conventional differential ring oscillator, the single-ended oscillation device 300 of the invention generates the fully differentially signals, thereby achieving the goal of reducing the circuit cost and the power consumption.

Figure 4A:
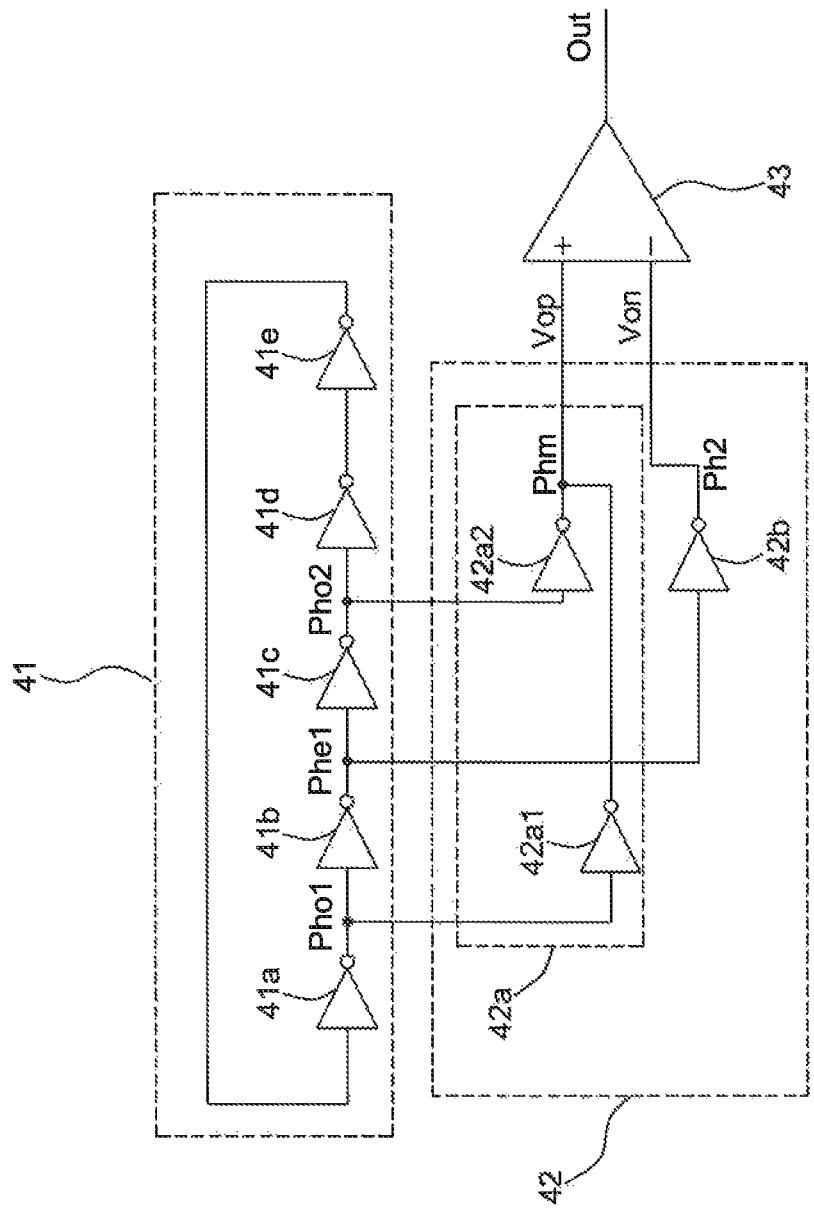
FIG. 4A is a schematic diagram showing a single-ended oscillation device for generating a fully differential signal according to another embodiment of the invention.

FIG. 4A is a schematic diagram showing a single-ended oscillation device 400 for generating a fully differential signal according to an embodiment of the invention. The single-ended oscillation device 400 includes a single-ended ring oscillator 41, a phase processing unit 42 and an amplifier 43.

The single-ended ring oscillator 41 includes an odd number of inverting delay units, e.g., 41a-41e, as shown in FIG. 4A. Here, each of odd-numbered inverting delay units generates an odd number signal while each even-numbered inverting delay unit delays the odd number signal of its previous-stage odd-numbered inverting delay unit to generate an even number signal. A first odd-numbered inverting delay unit 41a generates a first odd number signal Pho1. A first even-numbered inverting delay unit 41b delays the first odd number signal Pho1 to generate a first even number signal Phe1. A second odd-numbered inverting delay unit 41c delays the first even number signal Phe1 to generate a second odd number signal Pho2.

The phase processing unit 42 delays each odd number signal Pho and calculates (e.g., add or interpolate) two adjacent odd number signals, e.g., Pho1 and Pho2, to generate an intermediate signal Phm. Besides, the phase processing unit 42 delays an even number signal, e.g., Phe1, between the two adjacent odd number signals Pho1 and Pho2 and causes the delayed signal ph2 to be substantially aligned with the intermediate signal Phm. Here, the intermediate signal Phm and the delayed signal Ph2 are opposite to each other in phase, i.e., substantially having a phase difference of 180 degrees. The phase processing unit 42 includes a phase calculation unit 42a and a phase delay unit 42b. The phase calculation unit 42a includes a first inverting delay unit 42a1 and a second inverting delay unit 42a2.

Figure 4B:
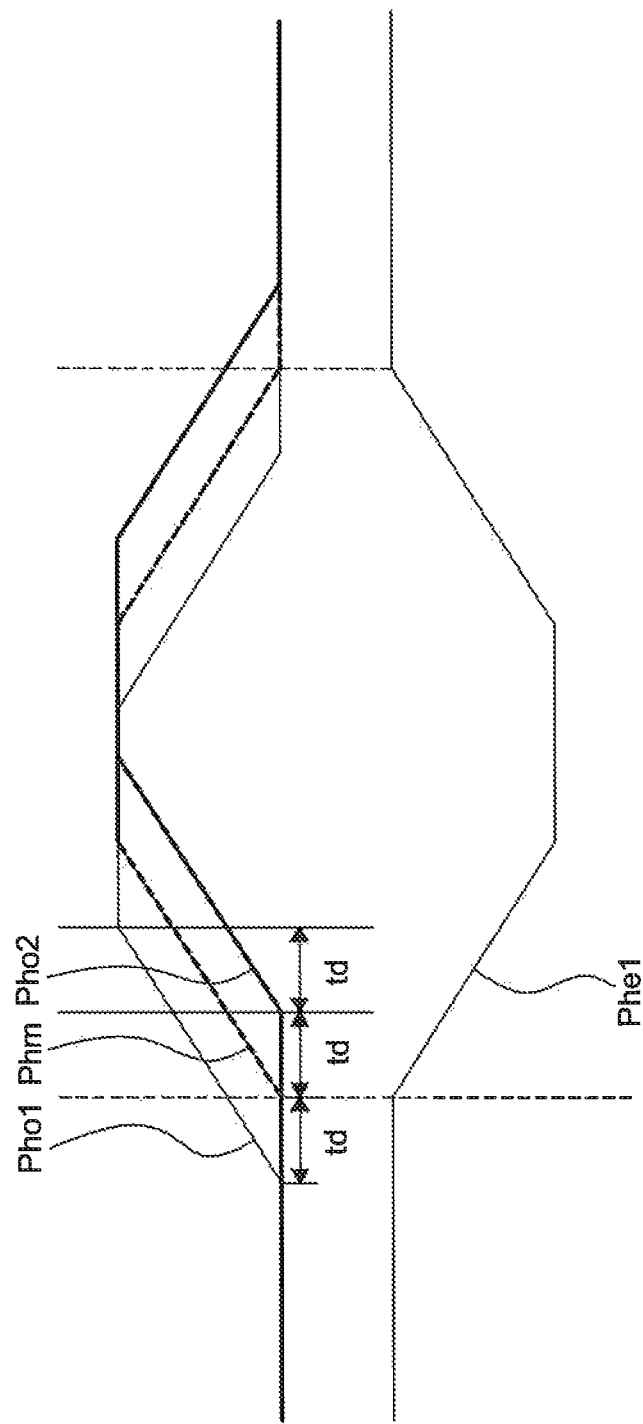
FIG. 4B is a wave diagram of the single-ended oscillation device for generating a fully differential signal of FIG. 4A.

As shown in FIG. 4B, the first odd-numbered inverting delay unit 41a delays an input signal by a predetermined period 1td to generate a first odd number signal pho1; the first even-numbered inverting delay unit 41b delays the first odd number signal pho1 by a predetermined period 1td to generate a first even number signal phe1. In other words, the first even number signal phe1 lags behind the input signal by 2td. The second odd-numbered inverting delay unit 41c delays the first even number signal phe1 by a predetermined period 1td to generate a second odd number signal pho2. In other words, the second odd number signal pho2 lags behind the input signal by 3td. During operation, the phase calculation unit 42a performs calculation (addition or interpolation) on the first odd number signal pho1 and the second odd number signal pho2 to generate an intermediate signal Phm that substantially lags behind the input signal by 2td. In this manner, the delayed signal ph2 and the intermediate signal Phm are substantially aligned and opposite to each other in phase by 180 degrees, so the intermediate signal Phm and the delayed signal Ph2 are used as the fully differential signals Vop and Von.

It is noted that since the first odd number signal Pho1, the second odd number signal Pho2 and the first even number signal phe1 have been respectively inverted and delayed by the inverting delay unit 42a1 and 42a2 and the phase delay unit 42b as shown in FIG. 4A, the first odd number signal Pho1, the second odd number signal Pho2 and the first even number signal phe1 still maintain their corresponding opposite relationships and delay period (s) as shown in FIG. 4B.

In one embodiment, since the size(width×length) of the phase processing unit 42 including the inverting delay unit 42a1 and 42a2 and the phase delay unit 42b is less than that of the single-ended ring oscillator 41 including the inverting delay units 41a-41e, thereby reducing the manufacturing cost in practice. In another embodiment, the gate width to length ratios (W/L) of the delay units 42a1, 42a2 and 42b are less than those of the inverting delay units 41a-41e, thus reducing the power consumption. In another embodiment, by adjusting the gate width to length ratios (W/L) of the delay units 42a1, 42a and 42b, a driving capability ratio of the delay units 42a1, 42a2 and 42b can be 1:1:2, causing the capabilities of driving the fully differential signals Vop and Von to be substantially equal. In another embodiment, by adjusting the product (W*L) of gate width multiplied by gate length of the delay units 42a1, 42a and 42b, a loading ratio of the delay units 42a1, 42a2 and 42b can be 1:1:1, causing the delay period of the intermediate signal Phm to be close to the average delay period of the first odd number signal Pho1 and the second odd number signal Pho2; besides, the intermediate signal Phm and the delayed signal Ph2 are substantially aligned and opposite in phase by 180 degrees. Further, the invention can meet the circuit design needs by adjusting the gate width to length ratios (W/L) and the product (W*L) of the delay units 42a1, 42a and 42b.

Then, the amplifier 43 amplifies the fully differential signal Vop and Von to generate a full swing signal with a duty cycle of 50%. In this manner, without using the conventional differential ring oscillator, the single-ended oscillation device 400 of the invention can generate the full swing signal, capable of achieving the goal of reducing the circuit cost and the power consumption.

Figure 4C:
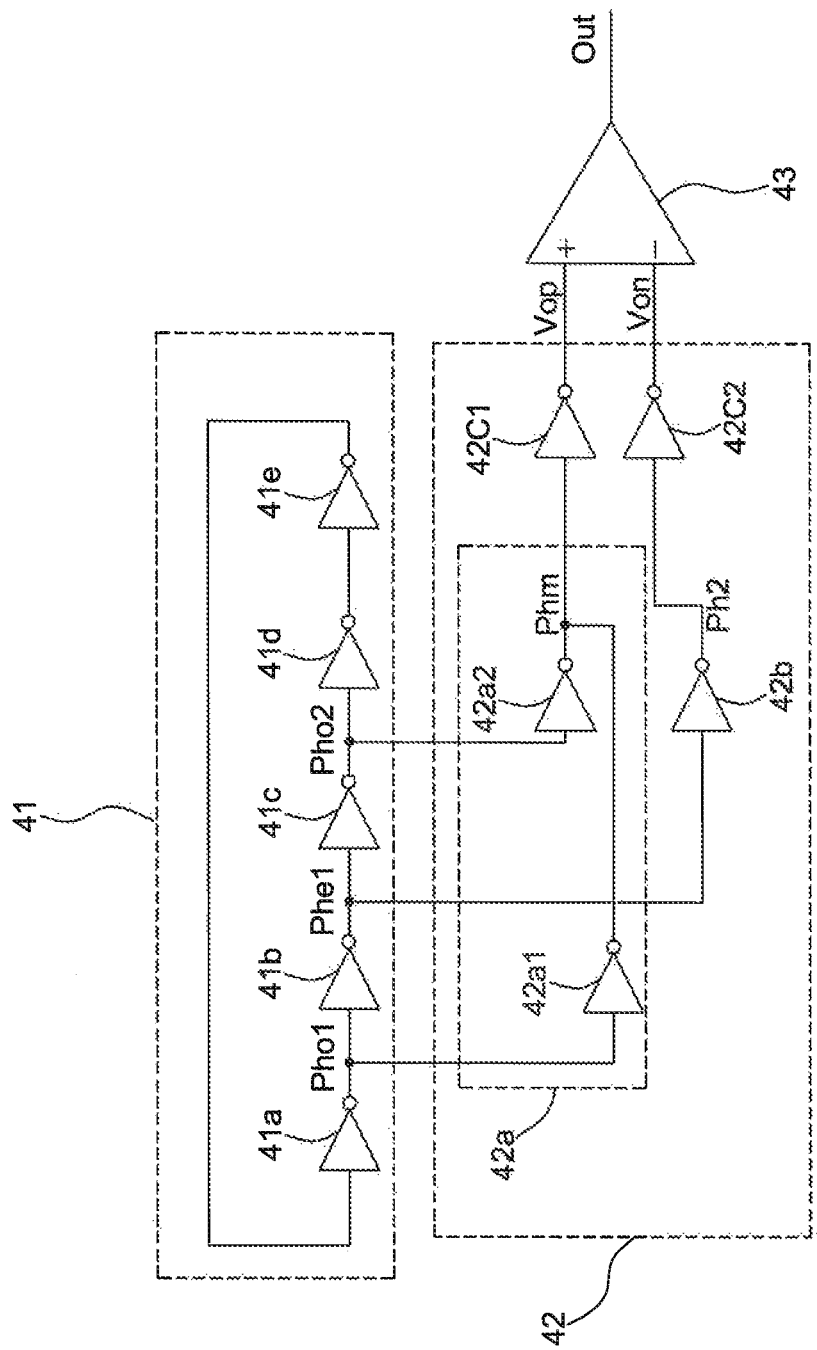
FIG. 4C is a schematic diagram showing a single-ended oscillation device for generating a fully differential signal according to another embodiment of the invention.

In an embodiment of the single-ended oscillation device 400 of FIG. 4C, two buffers 42C1 and 42C2 are added between the phase processing unit 42 and the amplifier 43 for signal buffering protection.

It is noted that phase operations are performed on three adjacent output signals from the odd number of inverting delay units to produce the fully differential signal including two signals opposite to each other in phase. In another embodiment, any one of the even-numbered inverting delay units between the output signal of the first odd-numbered inverting delay unit and the output signal of the Nth odd-numbered inverting delay unit can be selected as one of the differential signal; besides, calculations are performed on the output signals of the first odd-numbered inverting delay unit and the $N^{th}$ odd-numbered inverting delay unit to obtain the other of the differential signal.

FIG. 5 is a flow chart showing a method of generating a fully differential signal by using a single-ended oscillation device according to an embodiment of the invention. Hereinafter, the method of generating a fully differential signal by using a single-ended oscillation device is described with reference to FIG. 5.

Step S502: Start.

Step S504: Generate a first signal, a second signal and a third signal by using a single-ended ring oscillator including an odd number of inverting delay units. Here, the first signal, the second signal and the third signal are oscillation signals.

Step S506: Generate an intermediate signal according to the first signal and the third signal. In an embodiment, the intermediate signal and the second signal have a phase difference of 180 degrees.

Step S508: Generate a fully differential signal according to the intermediate signal and the second signal.

Step S510: End.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. A single-ended oscillation device for generating a fully differential signal, comprising:
   a single-ended ring oscillator comprising an odd number of inverting delay units, the inverting delay units sequentially generating a first signal, a second signal and a third signal; and
   a phase processing unit for generating an intermediate signal according to the first signal and the third signal and outputting the intermediate signal and the second signal as the fully differential signal;
   wherein the intermediate signal and the second signal are substantially opposite to each other in phase.

2. The device according to claim 1, further comprising:
   an amplifier for amplifying the fully differential signal to generate a full swing signal.

3. The device according to claim 1, wherein the phase processing unit adds or interpolates the first signal and the third signal to generate the intermediate signal.

4. The device according to claim 3, wherein the intermediate signal and the second signal have a phase difference of 180 degrees.

5. The device according to claim 2, wherein the full swing signal has a duty cycle of 50%.

6. The device according to claim 1, wherein the first signal, the second signal and the third signal are generated by three adjacent inverting delay units selected from the odd number of inverting delay units.

7. A single-ended oscillation device for generating a fully differential signal, comprising:
   a single-ended ring oscillator comprising an odd number of inverting delay units, wherein each odd-numbered inverting delay unit generates an odd number signal and each even-numbered inverting delay unit delays a corresponding odd number signal of its previous-stage odd-numbered inverting delay unit to generate an even number signal; and
   a phase processing unit for delaying each odd number signal to generate a delayed odd number signal, wherein the phase processing unit generates an intermediate signal according to two adjacent delayed odd number signals and delays a corresponding even number signal between two adjacent odd number signals associated with the two adjacent delayed odd number signals to generate the fully differential signal;
   wherein the corresponding even number signal and the intermediate signal are aligned and opposite to each other in phase.

8. The device according to claim 7, wherein the phase processing unit comprises:
   a phase calculation unit for adding or interpolating the two adjacent odd number signals to generate the intermediate signal; and
   a phase delay unit for inverting and delaying the corresponding even number signal.

9. The device according to claim 8, wherein the phase calculation unit comprises a first inverting delay unit and a second inverting delay unit for inverting and delaying the two adjacent odd number signals, respectively.

10. The device according to claim 9, wherein sizes of the first inverting delay unit, the second inverting delay unit and the phase delay unit are less than that of the inverting delay unit of the single-ended ring oscillator.

11. The device according to claim 9, wherein a driving capability ratio of the first inverting delay unit, the second inverting delay unit and the phase delay unit is 1:1:2.

12. The device according to claim 9, wherein a loading ratio of the first inverting delay unit, the second inverting delay unit and the phase delay unit is 1:1:1.

13. A method for generating a fully differential signal by using single-ended oscillation device, comprising:
   generating a first signal, a second signal and a third signal by using a single-ended ring oscillator including an odd number of inverting delay units;
   generating an intermediate signal according to the first signal and the third signal; and
   generating a fully differential signal according to the intermediate signal and the second signal;
   wherein the first signal, the second signal and the third signal are oscillation signals.

* * * * *